United States Patent
Kim et al.

(10) Patent No.: US 8,467,216 B2
(45) Date of Patent: Jun. 18, 2013

(54) SEMICONDUCTOR MEMORY DEVICE FOR REDUCING BIT LINE COUPLING NOISE

(75) Inventors: Sang-yun Kim, Hwaseong-si (KR); Tai-young Ko, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 276 days.

(21) Appl. No.: 12/917,832

(22) Filed: Nov. 2, 2010

(65) Prior Publication Data

US 2011/0182099 A1    Jul. 28, 2011

(30) Foreign Application Priority Data

Jan. 25, 2010   (KR) ........................ 10-2010-0006498

(51) Int. Cl.
*G11C 5/06* (2006.01)

(52) U.S. Cl.
USPC ........................................ 365/63; 365/230.03

(58) Field of Classification Search
USPC .............................................. 365/63, 230.03
See application file for complete search history.

(56) References Cited

U.S. PATENT DOCUMENTS

| | | | |
|---|---|---|---|
| 6,396,727 B1 | 5/2002 | Schoenfeld et al. | |
| 6,500,706 B1 | 12/2002 | Chi | |
| 2006/0227649 A1 | 10/2006 | Lien et al. | |
| 2008/0112251 A1* | 5/2008 | Youn et al. | 365/230.03 |

FOREIGN PATENT DOCUMENTS

KR    1020030041817    5/2003

* cited by examiner

*Primary Examiner* — Anthan Tran
(74) *Attorney, Agent, or Firm* — F. Chau & Associates, LLC

(57) ABSTRACT

A semiconductor memory device including: first and second memory cell arrays each including at least one word line, at least three bit lines, and memory cells; and a sense amplifier area disposed between the first and second memory cell arrays and including a sense amplifier circuit for sensing and amplifying data of the memory cells, wherein the at least three bit lines of the first memory cell array and the at least three bit lines of the second memory cell array extend in a first direction and the at least three bit lines of the first and the second memory cell arrays are respectively connected to data lines disposed in a second direction, and wherein a bit line located between two of the at least three bit lines of each of the first and the second memory cell arrays is connected to an outermost data line of the data lines.

6 Claims, 9 Drawing Sheets

SEMICONDUCTOR MEMORY DEVICE FOR REDUCING BIT LINE COUPLING NOISE

CROSS-REFERENCE TO RELATED APPLICATION

This application claims priority under 35 U.S.C. §119 to Korean Patent Application No. 10-2010-0006498, filed on Jan. 25, 2010, in the Korean Intellectual Property Office, the disclosure of which is incorporated by reference herein in its entirety.

BACKGROUND

1. Technical Field

The inventive concept relates to a semiconductor memory device, and more particularly, to a semiconductor memory device for reducing bit line coupling noise.

2. Discussion of the Related Art

Semiconductor memory devices having large storage capacity, low power consumption, and fast operational performance are being, and have been, developed. However, as storage capacity increases, so does interference noise between adjacent bit lines of the semiconductor memory devices. Further, in semiconductor memory devices that have low power consumption, an operating voltage used to perform a data access operation, such as a read operation and a write operation, decreases. The interference noise between adjacent bit lines (also referred to as "bit line coupling noise") is caused by a coupling effect due to a parasitic capacitance existing between the adjacent bit lines. This noise can impact a voltage margin of a memory cell and a sensing margin of a bit line sense amplifier. Accordingly, there is a need to reduce bit line coupling noise.

SUMMARY

An exemplary embodiment of the inventive concept provides a semiconductor memory device for reducing bit line coupling noise.

An exemplary embodiment of the inventive concept also provides a memory module including the semiconductor memory device.

An exemplary embodiment of the inventive concept also provides a system including the semiconductor memory device.

According to an exemplary embodiment of the inventive concept, there is provided a semiconductor memory device including: first and second memory cell arrays each including at least one word line, at least three bit lines disposed in a direction perpendicular to the at least one word line, and memory cells disposed at intersections between the at least one word line and the at least three bit lines; and a sense amplifier area disposed between the first and second memory cell arrays and including a sense amplifier circuit for sensing and amplifying data of the memory cells, wherein the at least three bit lines of the first memory cell array and the at least three bit lines of the second memory cell array extend in a first direction in the sense amplifier area and the at least three bit lines of the first and the second memory cell arrays are respectively connected to data lines disposed in a second direction in the sense amplifier area, and wherein a bit line located between two of the at least three bit lines of each of the first and the second memory cell arrays is connected to an outermost data line of the data lines.

The at least three bit lines may include a first conductive wiring layer, and the data lines may include a second conductive wiring layer.

The second direction may be perpendicular to the first direction.

Each bit line of the second memory cell array and its corresponding bit line of the first memory cell array may form a complementary bit line pair.

The semiconductor memory device may be included in a memory chip of a memory module, and the memory chip may be mounted on a printed circuit board.

The semiconductor memory device may be included in a system having a controller for controlling the semiconductor memory device through a bus.

According to an exemplary embodiment of the inventive concept, there is provided a semiconductor memory device including: first and second memory cell arrays each including a plurality of word lines, bit lines disposed to intersect the word lines, and a plurality of memory cells disposed at intersections between the word lines and the bit lines; and a sense amplifier area disposed between the first and the second memory cell arrays and including sense amplifier circuits for sensing and amplifying data of the memory cells, wherein bit lines of the first memory cell array and bit lines of the second memory cell array extend into the sense amplifier area, and wherein a portion of a first bit line in at least one of the first and the second memory cell arrays has a width greater than a portion of the first bit line of the sense amplifier area.

A distance between the portion of the first bit line and a second bit line in the sense amplifier area may be greater than a distance between the portion of the first bit line and a third bit line in the first and the second memory cell arrays.

The second bit line may be adjacent to the portion of the first bit line in the sense amplifier area and the third bit line may be adjacent to the portion of the first bit line in the at least one of the first and second memory cell arrays.

The portion of the first bit line in the at least one of the first and the second memory cell arrays has a resistive component that is less than a resistive component of the portion of the first bit line in the sense amplifier area.

The semiconductor memory device may be included in a memory chip of a memory module, and the memory chip may be mounted on a printed circuit board.

The semiconductor memory device may be included in a system having a controller for controlling the semiconductor memory device through a bus.

According to an exemplary embodiment of the inventive concept, there is provided a semiconductor memory device including: first and second memory cell arrays each including a plurality of word lines, bit lines disposed to intersect the word lines, and a plurality of memory cells disposed at intersections between the word lines and the bit lines; and a sense amplifier area disposed between the first and the second memory cell arrays and including sense amplifier circuits for sensing and amplifying data of the memory cells, wherein bit lines of the first memory cell array and bit lines of the second memory cell array extend into the sense amplifier area, and wherein a doping density of a portion of a first bit line in at least one of the first and the second memory cell arrays is higher than a doping density of a portion of the first bit line in the sense amplifier area.

A width of the portion of the first bit line in at least one of the first and the second memory cell arrays may be the same as a width of the portion of the first bit line in the sense amplifier area.

A distance between the portion of the first bit line and a second bit line in the sense amplifier area may be the same as a distance between the portion of the first bit line and a third bit line in the at least one of the first and second memory cell arrays.

The second bit line may be adjacent to the portion of the first bit line in the sense amplifier area and the third bit line may be adjacent to the portion of the first bit line in the at least one of the first and second memory cell arrays.

The semiconductor memory device may be included in a memory chip of a memory module, and the memory chip may be mounted on a printed circuit board.

The semiconductor memory device may be included in a system having a controller for controlling the semiconductor memory device through a bus.

The portion of the first bit line in at least one of the first and second memory cell arrays may have a resistive component less than a resistive component of the portion of the first bit line in the sense amplifier area.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Figure 1:
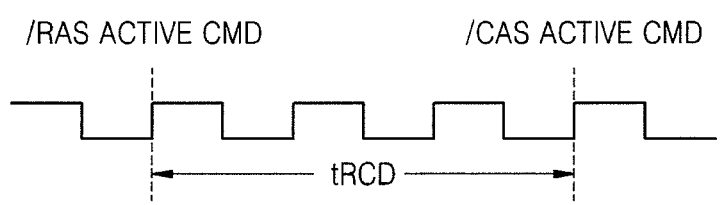
FIG. 1 is a view for explaining a row address strobe (/RAS) to column address strobe (/CAS) delay time (tRCD) timing parameter.

Exemplary embodiments of the inventive concept are described more fully hereinafter with reference to the accompanying drawings. In the drawings, the same reference numerals may denote the same elements.

Among semiconductor memory devices having large storage capacity, low power consumption and fast operational performance, a dynamic random access memory (DRAM) senses and amplifies data read from a memory cell by using a bit line sense amplifier. The bit line sense amplifier does this by developing a voltage difference between a bit line pair, which is caused by a charge-shared between the bit line receiving the data and a capacitor of the memory cell sending the data. Data sensed and amplified by the bit line sense amplifier is transmitted to a data line and is sensed and amplified by a data line sense amplifier to be read out.

A row address strobe (/RAS) to column address strobe (/CAS) delay time (tRCD), which is a parameter that contributes to the high-speed operation of the DRAM, refers to, as shown in FIG. 1, a time between an /RAS active command and a /CAS active command. As the tRCD time decreases, the DRAM operates at a higher speed. The /RAS active command activates a word line to which a memory cell to be read is connected. Once the word line is activated, data of all memory cells connected to the word line is transmitted to corresponding bit lines. A bit line sense amplifier develops a voltage difference between a bit line pair by amplification and sensing of memory cell data transmitted to the bit line pair to produce a binary logic signal as data. The /CAS active command activates a column select signal, and transmits data of the bit line pair of the memory cell to be read to a data line pair.

Figure 2:
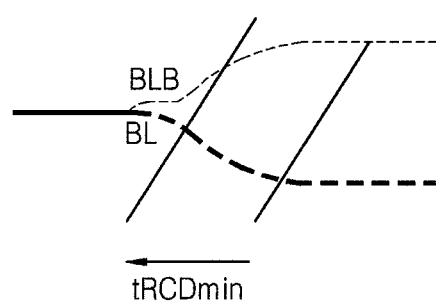
FIG. 2 is a view for explaining a relationship between data amplification of a bit line pair and tRCD timing.

FIG. 2 is a view for explaining a relationship between data amplification of a bit line pair and tRCD timing. Referring to FIG. 2, in a waveform where memory cell data transmitted to a bit line pair BL and BLB is charge-shared and amplified and a voltage level on the bit line pair BL and BLB is developed, after the voltage level on the bit line pair BL and BLB is sufficiently developed, data of the bit line pair BL and BLB is transmitted to a pair of data lines by a column select signal. As a tRCD time decreases, a DRAM operates at a higher speed, as mentioned prior. However, if the tRCD time is reduced to a minimum time, the data of the bit line pair BL and BLB may be transmitted to the data line pair before being completely amplified. Thus, coupling noise generated between the bit line pair BL and BLB in an amplification process using a bit line sense amplifier may degrade a voltage margin of a memory cell and a sensing margin of the bit line sense amplifier.

Figure 3:
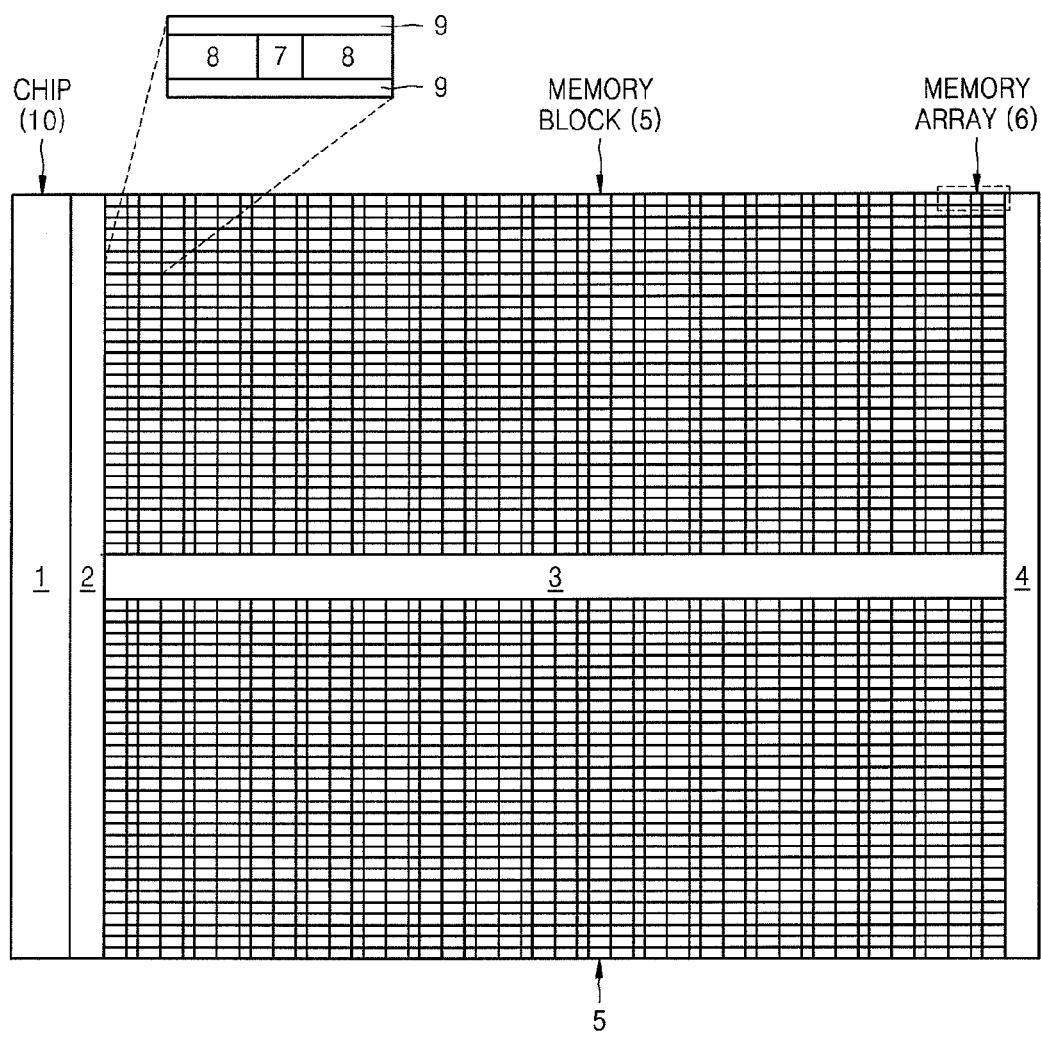
FIG. 3 is a view for explaining an arrangement of a semiconductor memory device according to an exemplary embodiment of the inventive concept.

FIG. 3 is a view for explaining an arrangement of a semiconductor memory device 10 according to an exemplary embodiment of the inventive concept. Referring to FIG. 3, the semiconductor memory device 10 includes a memory control circuit block 1, a read and write amplifier and column select circuit block 2, a row decoder and word line driving circuit block 3, an internal power generation circuit block 4, and memory blocks 5 disposed under and over the row decoder and word line driving circuit block 3. The memory blocks 5 include memory arrays 6. As shown in an enlarged view, the memory arrays 6 include memory cell arrays (hereinafter, referred to as "sub arrays") 8 disposed in two columns, a sense amplifier area 7 disposed between two sub arrays 8 of the same row, and a sub word line driving circuit area 9 disposed between upper and lower sub arrays.

Figure 4A:
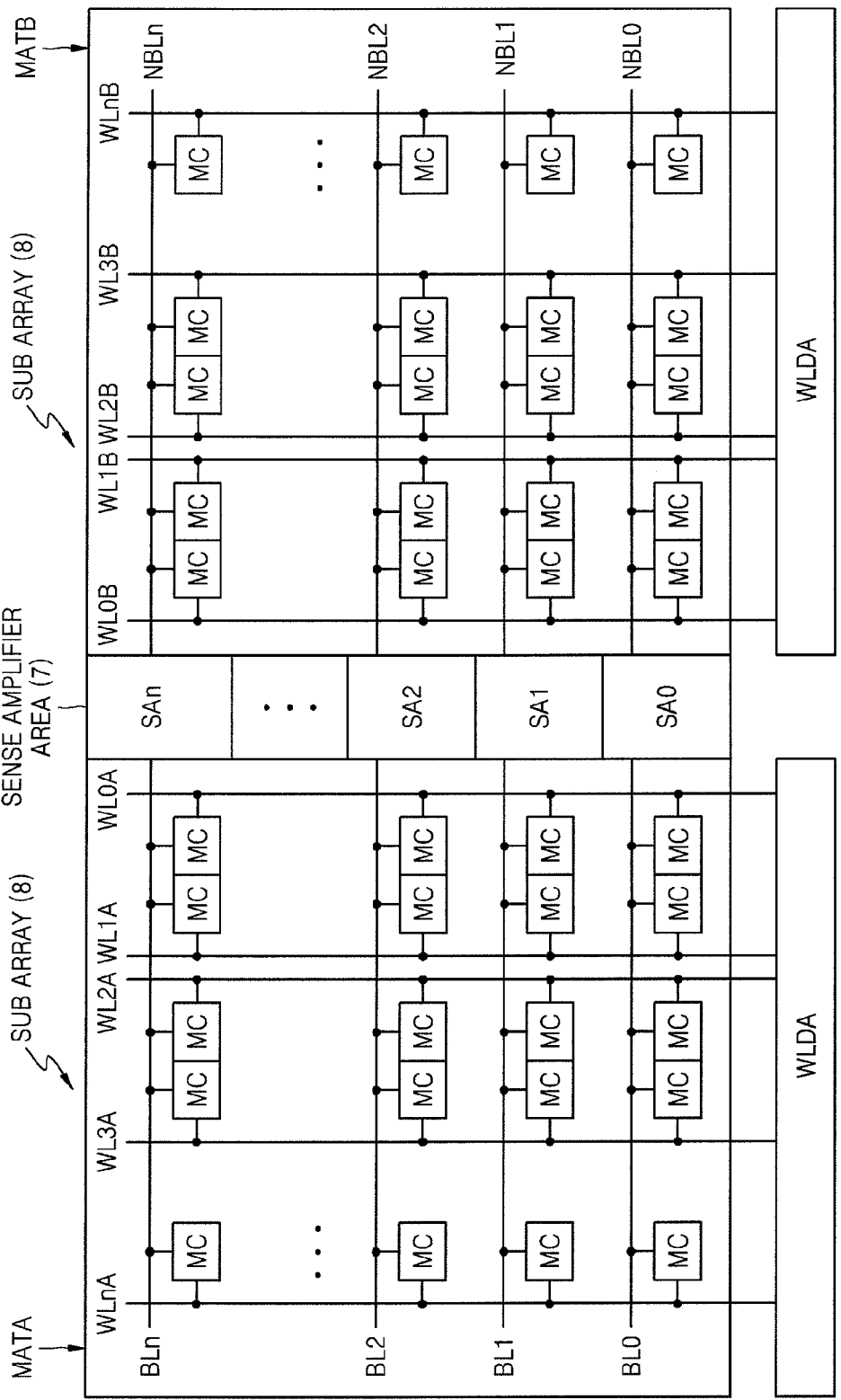
FIGS. 4A and 4B are views for explaining two sub arrays and a sense amplifier area disposed between the two sub arrays illustrated in FIG. 3.
Figure 4B:
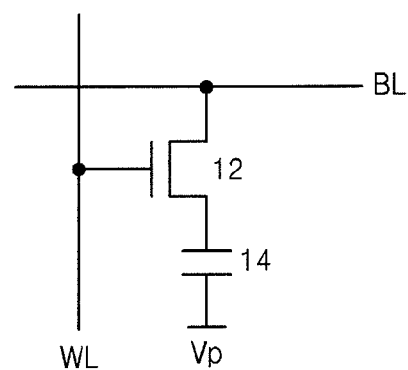

FIGS. 4A and 4B are views for explaining two sub arrays and a sense amplifier area disposed between the two sub arrays illustrated in the enlarged view of FIG. 3. Referring to FIG. 4A, a sub array 8 (hereinafter, referred to as "a first sub array MATA") is disposed on the left side of the sense amplifier area 7 and another sub array 8 (hereinafter, referred to as "a second sub array MATB") is disposed on the right side of the sense amplifier area 7. In the first and second sub arrays MATA and MATB, memory cells MCs are respectively disposed at intersections between word lines WL0A through WLnA and bit lines BL0 through BLn and word lines WL0B through WLnB and bit lines NBL0 through NBLn. Bit line sense amplifier circuits SA0 through SAn for sensing and amplifying data of memory cells MCs are disposed in the sense amplifier area 7. The first and second sub arrays MATA and MATB are arranged in an open bit line architecture in which each of the bit lines BL0 through BLn of the first sub array MATA and each of the bit lines NBL0 through NBLn of the second sub array MATB with the sense amplifier area 7 therebetween form one complementary bit line pair. Each of the memory cells MCs includes a cell capacitor 14 and a cell transistor 12 connected to a word line WL and a bit line BL, as shown in FIG. 4B.

Figure 5:
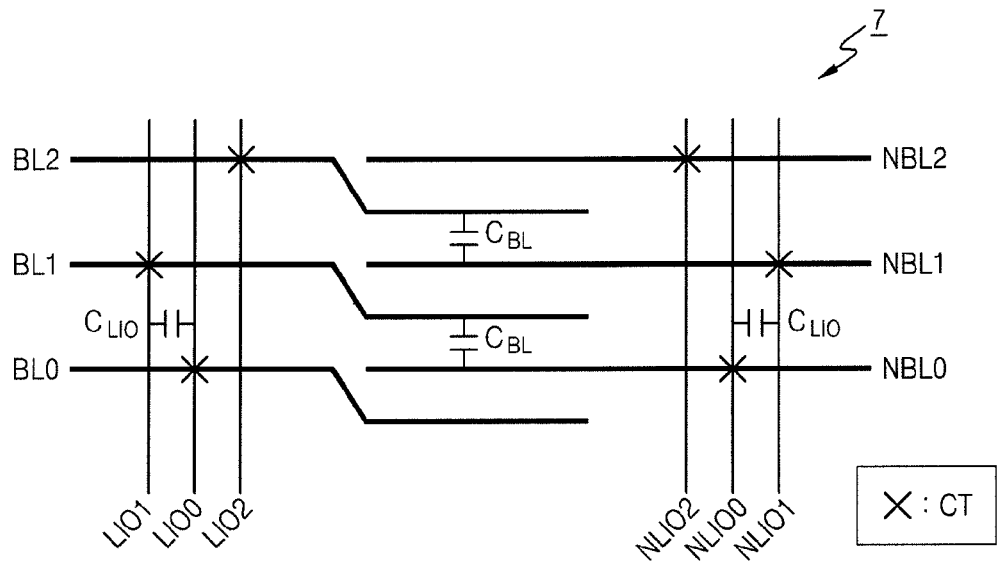
FIG. 5 is a view for explaining an interconnection relationship between bit lines and data lines disposed in the sense amplifier area of FIG. 4A.

FIG. 5 is a view for explaining an interconnection relationship between bit lines and data lines disposed in the sense amplifier area 7 of FIG. 4A. FIG. 5 shows one unit interconnection pattern in which, from among the bit line pairs BL0 and NBL0 through BLn through NBLn of FIG. 4A, the first through third bit line pairs BL0 and NBL0 through BL2 and NBL2 are connected to first through third data line pairs LIO0 and NLIO0 through LIO2 and NLIO2. The bit line pairs BL0 and NBL0 through BLn and NBLn are formed on a first conductive wiring layer, and the first through third data line pairs LIO0 and NLIO0 through LIO2 and NLIO2 are formed on a second conductive wiring layer. The first conductive wiring layer may be a polysilicon wiring layer or a first metal wiring layer. If the first conductive wiring layer is a polysilicon wiring layer, the second conductive wiring layer may be a first metal wiring layer, and if the first conductive wiring layer is a first metal wiring layer, the second conductive wiring layer may be a second metal wiring layer. CT marked by X in FIG. 5 denotes a contact between the first conductive wiring layer and the second conductive wiring layer.

Data of the first through third bit line pairs BL0 and NBL0 through BLn and NBLn is sensed and amplified by the bit line sense amplifier circuits SA0 through SAn and transmitted to the first through third data line pairs LIO0 and NLIO0 through LIO2 and NLIO2. In the bit line sense amplifier circuits SA0 through SAn, since the second bit line pair BL1 and NBL1 is adjacent to the first bit line pair BL0 and NBL0 and the third bit line pair BL2 and NBL2, the second bit line pair BL1 and NBL1 is affected by interference noise caused by a parasitic capacitance $C_{BL}$ between the adjacent bit lines.

The second data line LIO1 to which data of the second bit line BL1 is transmitted is an outermost data line from among the data lines LIO0, LIO1, and LIO2, and the second complementary data line NLIO1 to which data of the second complementary bit line NBL1 is transmitted is an outermost complementary data line from among the complementary data lines NLIO0, NLIO1, and NLIO2. The second data line pair LIO1 and NLIO1 is affected by interference noise caused by a parasitic capacitance $C_{LIO}$ between the first data line pair LIO0 and NLIO0 which is adjacent the second data line pair LIO1 and NLIO1. In other words, the second data line pair LIO1 and NLIO1 is affected by coupling noise between the second data line pair LIO1 and NLIO1 and the first data line pair LIO0 and NLIO0.

Figure 6:
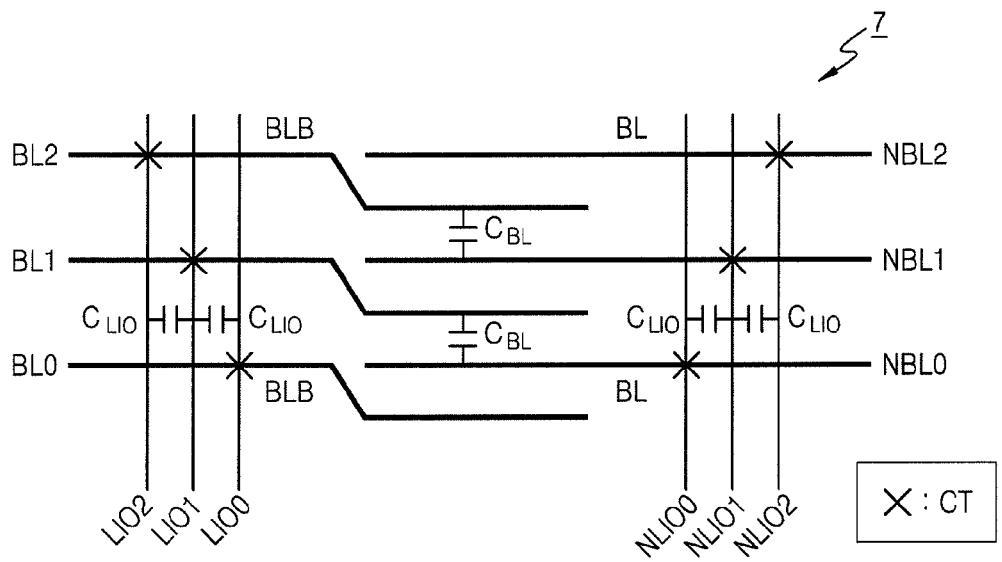
FIG. 6 illustrates a connection relationship between bit lines and data lines, as a comparative example to FIG. 5.

FIG. 6 illustrates an interconnection relationship between bit lines and data lines, as a comparative example to FIG. 5. In FIG. 6, since the second data line pair LIO1 and NLIO1 is disposed adjacent to the first data line pair LIO0 and NLIO0 and the second data line pair LIO2 and NLIO2, the second data line pair LIO1 and NLIO1 is affected by interference noise caused by a parasitic capacitance $C_{LIO}$ between the adjacent data lines. In other words, the second data line pair LIO1 and NLIO1 is affected by coupling noise with the two data line pairs, namely, the first and second data line pairs LIO0 and NLIO0, and LIO2 and NLIO2. Accordingly, data of the second bit line pair BL1 and NBL1, which is located between the first through third bit lines BL0 and NBL0 through BLn and NBLn, is affected by coupling noise between the first bit line pair BL0 and NBL0 and the second bit line pair BL2 and NBL2 and then affected by coupling noise between the first data line pair LIO0 and NLIO0 and the third data line pair LIO2 and NLIO2.

Referring back to FIG. 5, data of the second bit line pair BL1 and NBL1 of FIG. 5 is not affected by coupling noise of the third data line pair LIO2 and NLIO2, unlike data of the second bit line pair BL1 and NBL1 of FIG. 6, thereby reducing overall coupling noise.

Figure 7:
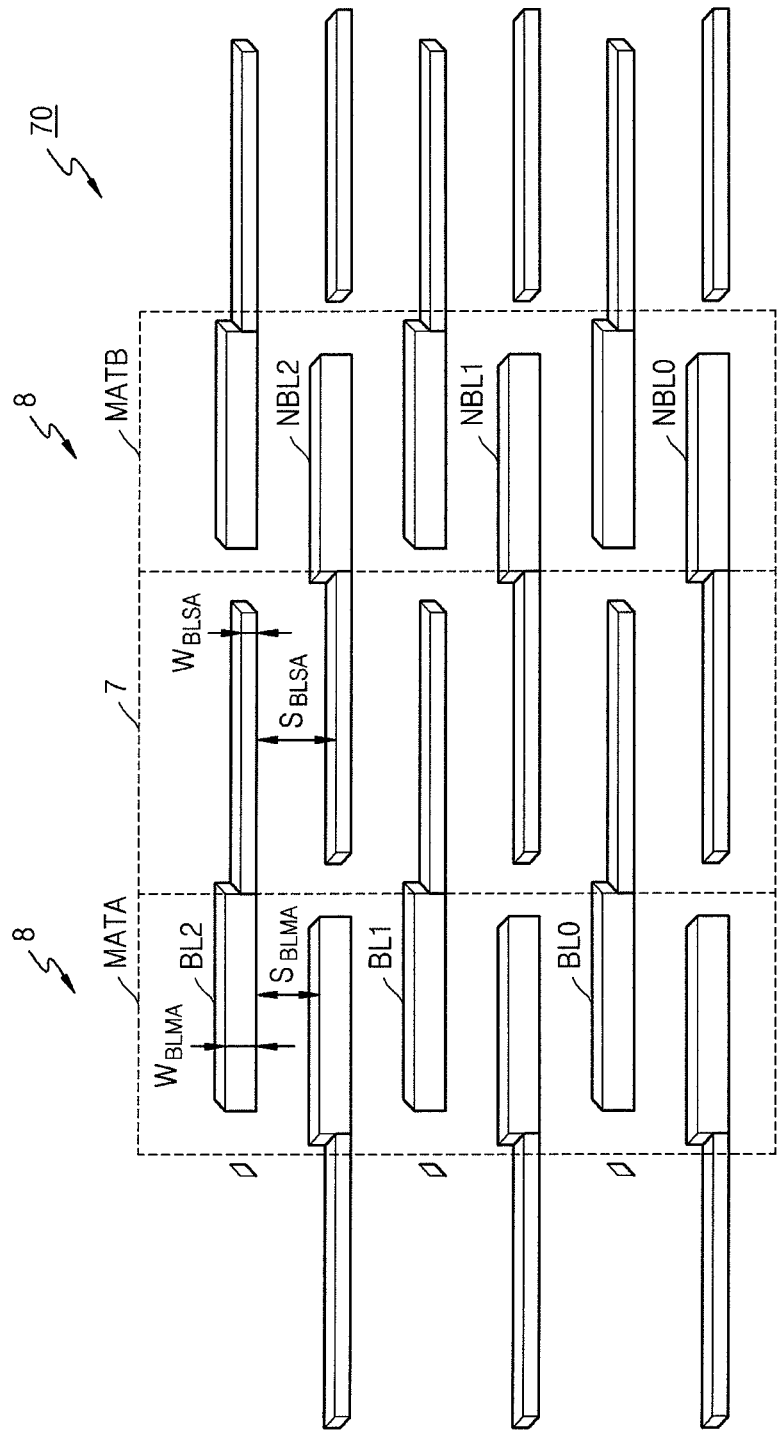
FIG. 7 is a view for explaining a semiconductor memory device according to an exemplary embodiment of the inventive concept.

FIG. 7 is a view for explaining a semiconductor memory device 70 according to an exemplary embodiment of the inventive concept. Referring to FIG. 7, the semiconductor memory device 70 includes bit lines BL0 through BL2 in the first sub array MATA, the sense amplifier area 7, and bit lines NBL0 through NBLn in the second sub array MATB as explained in FIG. 4A. The bit lines BL0 through BL2, and NBL0 through NBLn are formed of the same conductive wiring layer in the sense amplifier area 7 and the first and second sub arrays MATA and MATB. For example, the conductive wiring layer may be a polysilicon wiring layer or a first metal wiring layer.

The bit lines BL0 through BL2, and NBL0 through NBLn of the first and second sub arrays MATA and MATBA have different widths from those of the bit lines BL0 through BL2, and NBL0 through NBLn of the sense amplifier area 7. Each of the bit lines BL0 through BL2, and NBL0 through NBLn of the first and second sub arrays MATA and MATB has a first width $W_{BLMA}$, and each of the bit lines BL0 through BL2, and NBL0 through NBLn of the sense amplifier area 7 has a second width $W_{BLSA}$. The first width $W_{BLMA}$ is greater than the second width $W_{BLSA}$.

The bit lines BL0 through BL2 extending in parallel in the first sub array MATA, and the complementary bit lines NBL0 through NBLn extending in parallel in the second sub array MATB are disposed in the sense amplifier area 7. To minimize coupling noise between the bit lines BL0 through BL2, and NBL0 through NBLn in the sense amplifier area 7, a distance $S_{BLSA}$ between the bit lines BL0 through BL2, and NBL0 through NBLn is optimized. Accordingly, a width of each of the bit lines BL0 through BL2, and NBL0 through NBLn of the sense amplifier area 7 has the second width $W_{BLSA}$.

Since each of the bit lines BL0 through BL2, and NBL0 through NBLn of the first and second sub arrays MATA and MATB has the first width $W_{BLMA}$ that is greater than the second width $W_{BLSA}$ of each of the bit lines BL0 through BL2, and NBL0 through NBLn of the sense amplifier area 7, a distance $S_{BLMA}$ between the bit lines BL0 through BL2, and NBL0 through NBLn of the first and second sub arrays MATA and MATB is less than the distance $S_{BLSA}$ between the bit lines BL0 through BL2, and NBL0 through NBLn of the sense amplifier area 7. Accordingly, the first and second sub arrays MATA and MATB may be more greatly affected by coupling noise between the bit lines BL0 through BL2, and NBL0 through NBLn than the sense amplifier area 7. However, coupling noise between the bit lines BL0 through BL2, and NBL0 through NBLn of the first and second sub arrays MATA and MATB is reduced by the shielding function of a wiring pattern of the bit lines BL0 through BL2, and NBL0 through NBLn of the first and second sub arrays MATA and MATB.

The bit lines BL0 through BL2, and NBL0 through NBLn of the first and second sub arrays MATA and MATB each having the first width $W_{BLMA}$ have a resistive component that is less than that of the bit lines BL0 through BL2, and NBL0 through NBLn of the sense amplifier area 7 each having the second width $W_{BLSA}$. Accordingly, a line load on the bit lines BL0 through BL2, and NBL0 through NBLn of the first and second sub arrays MATA and MATB may be reduced. Further, since the distance $S_{BLSA}$ between the bit lines BL0 through BL2, and NBL0 through NBLn of the sense amplifier area 7 is greater than the distance $S_{BLMA}$ between the bit lines BL0 through BL2, and NBL0 through NBLn of the first and second sub arrays MATA and MATB, coupling noise between the bit lines BL0 through BL2, and NBL0 through NBLn of the sense amplifier area 7 may be reduced.

Since a line load on the bit lines BL0 through BL2, and NBL0 through NBLn of the first and second sub arrays MATA and MATB is reduced and coupling noise between the bit lines BL0 through BL2, and NBL0 through NBLn of the first and second sub arrays MATA and MATB is also reduced, a sufficient voltage margin of a memory cell and a sufficient sensing margin of a sense amplifier in an amplification process using a bit line sense amplifier may be ensured.

Figure 8:
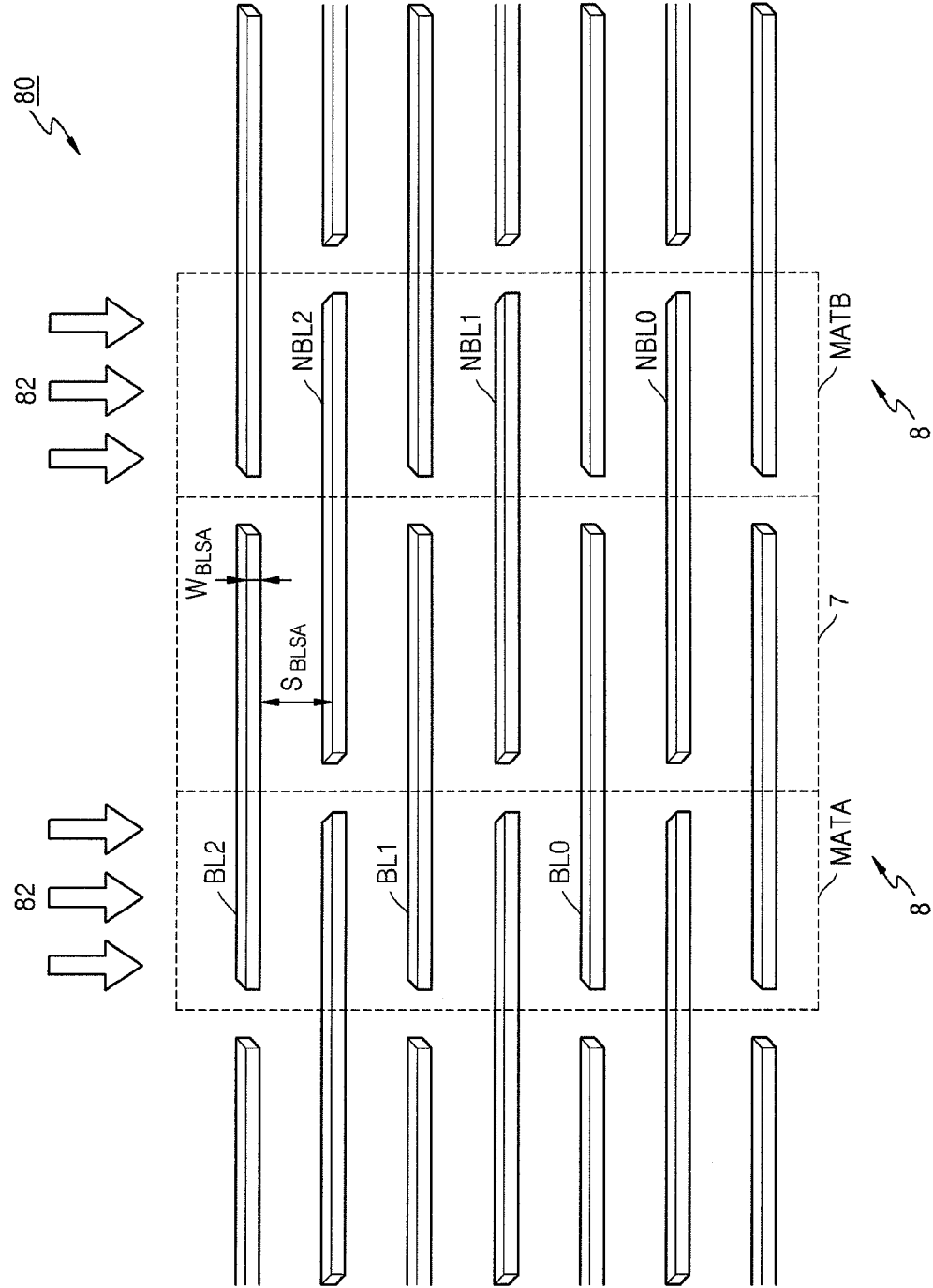
FIG. 8 is a view for explaining a semiconductor memory device according to an exemplary embodiment of the inventive concept.

FIG. 8 is a view for explaining a semiconductor memory device 80 according to an exemplary embodiment of the inventive concept. Referring to FIG. 8, the semiconductor memory device 80 includes bit lines BL0 through BL2 in the first sub array MATA, the sense amplifier area 7, and bit lines NBL0 through NBLn the second sub array MATB as explained in FIG. 4A. The bit lines BL0 through BL2, and NBL0 through NBLn are formed of the same conductive wiring layer in the sense amplifier area 7 and the first and second sub arrays MATA and MATB. For example, the conductive wiring layer may be a polysilicon wiring layer or a first metal wiring layer.

To minimize coupling noise between the bit lines BL0 through BL2, and NBL0 through NBLn in the sense amplifier area 7, a distance $S_{BLSA}$ between the bit lines BL0 through BL2, and NBL0 through NBLn in the sense amplifier area 7 is optimized. Accordingly, when a pitch of each of the bit lines BL0 through BL2, and NBL0 through NBLn in the sense amplifier area 7 is considered, each of the bit lines BL0 through BL2, and NBL0 through NBLn of the sense amplifier area 7 has a width $W_{BLSA}$. Each of the bit lines BL0 through BL2, and NBL0 through NBLn of the first and second sub arrays MATA and MATB has the same width as the width $W_{BLSA}$ of each of the bit lines BL0 through BL2, and NBL0 through NBLn of the sense amplifier area 7.

Each of the bit lines BL0 through BL2, and NBL0 through NBLn of the sense amplifier area 7 and the first and second sub arrays MATA and MATB of FIG. 8 has the same width as the second width $W_{BLSA}$ as those described in FIG. 7. However, in FIG. 8, the bit lines BL0 through BL2, and NBL0 through NBLn of the first and second sub arrays MATA and MATB each having the second width $W_{BLSA}$ have a resistive component that is greater than that of the bit lines BL0 through BL2, and NBL0 through NBLn of the first and second sub arrays MATA and MATB each having the first width $W_{BLMA}$ of FIG. 7.

To reduce the resistive component of the bit lines BL0 through BL2, and NBL0 through NBLn of the first and second sub arrays MATA and MATB of FIG. 8, a process of increasing a doping density of the bit lines BL0 through BL2, and NBL0 through NBLn of the first and second sub arrays MATA and MATB is additionally performed. For example, if the bit lines BL0 through BL2, and NBL0 through NBLn of the first and second sub arrays MATA and MATB are formed as a polysilicon wiring layer, an N+ ion implantation process 82 is performed on the polysilicon wiring layer to compensate for an increased resistive component of the bit lines BL0 through BL2, and NBL0 through NBLn of the first and second sub arrays MATA and MATB each having the first width $W_{BLSA}$ of FIG. 8.

Since the increased resistive component is compensated for and the bit lines BL0 through BL2, and NBL0 through NBLn of the first and second sub arrays MATA and MATB are less affected by coupling noise, a sufficient voltage margin of a memory cell and a sufficient sensing margin of a sense amplifier in an amplification process using a bit line sense amplifier may be ensured.

Figure 9:
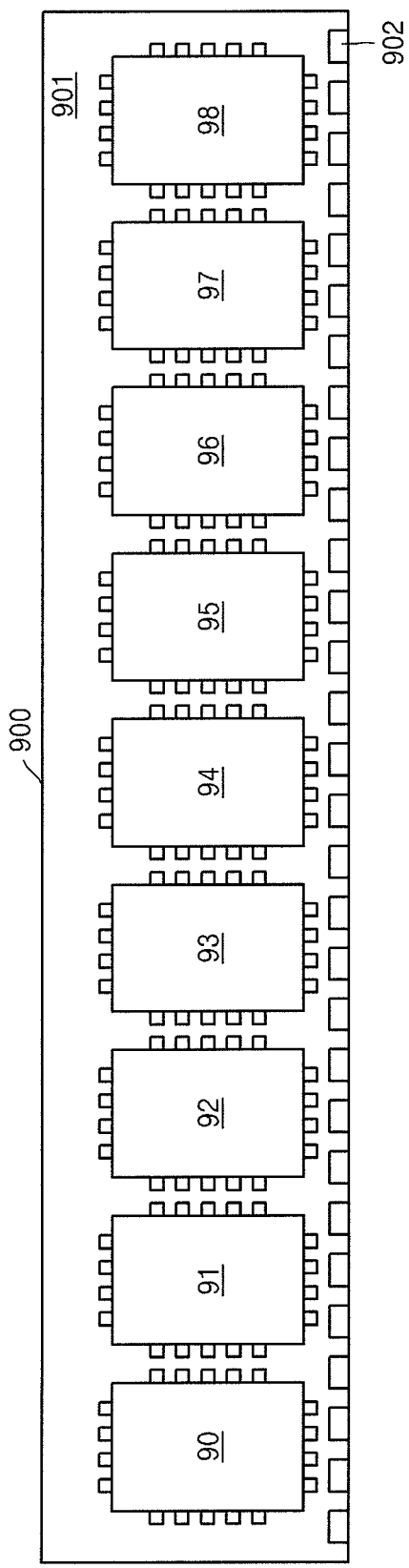
FIG. 9 is a view for explaining a memory module including memory chips including a semiconductor memory device, according to an exemplary embodiment of the inventive concept.

FIG. 9 is a view for explaining a memory module 900 including memory chips including a semiconductor memory device, according to an exemplary embodiment of the inventive concept. The memory module 900 of FIG. 9 includes memory chips 90 through 98 including the semiconductor memory devices 10, 70, and 80 of FIGS. 3, 7, and 8. The memory module 900 is a single in line memory module (SIMM) including the 9 memory chips 90 through 98 arranged on one surface of a printed circuit board (PCB) 901. The number of memory chips included in the SIMM typically varies in a range of 3 to 9, but is not limited thereto. The PCB 901 includes edge connectors 902 to be inserted into memory sockets on a computer mother board, along a longitudinal edge. Although not shown, a wiring pattern is formed on the PCB 901, and terminals or leads constituting the edge connectors 902 are connected to the memory chips 90 through 98.

Figure 10:
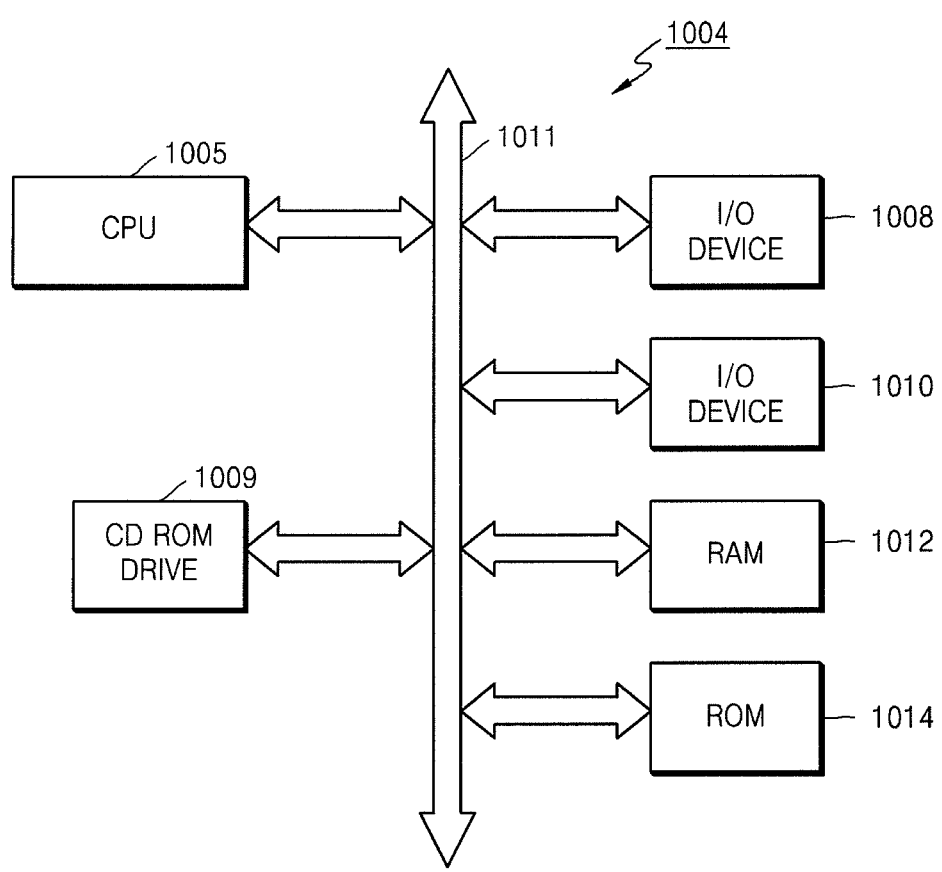
FIG. 10 is a block diagram for explaining a process-based system using a random access memory (RAM) that is realized as a semiconductor memory device, according to an exemplary embodiment of the inventive concept.

FIG. 10 is a block diagram for explaining a processor-based system 1004 using a random access memory (RAM) 1012 that is realized as a semiconductor memory device, according to an exemplary embodiment of the inventive concept. In other words, the RAM 1012 reduces bit line coupling noise as described with reference to FIG. 3, 7, or 8. The processor-based system 1004 may be a computer system, a processor control system, or a system employing a processor-related memory. The system 1004 includes a central processing unit (CPU) 1005, such as a microprocessor, for communicating with the RAM 1012 and input/output (I/O) devices 1008 and 1010 through a bus 1011. The system 1004 includes a read-only memory (ROM) 1014, and includes peripheral devices, such as a compact disk read-only memory (CD-ROM) driver 1009, for communicating with the CPU 1005 through the bus 1011.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A semiconductor memory device, comprising:
   first and second memory cell arrays each comprising at least one word line, at least three bit lines disposed in a direction perpendicular to the at least one word line, and memory cells disposed at intersections between the at least one word line and the at least three bit lines; and
   a sense amplifier area disposed between the first and second memory cell arrays and comprising a sense amplifier circuit for sensing and amplifying data of the memory cells,
   wherein the at least three bit lines of the first memory cell array and the at least three bit lines of the second memory cell array extend in a first direction in the sense amplifier area and the at least three bit lines of the first and the second memory cell arrays are respectively connected to data lines disposed in a second direction in the sense amplifier area, and
   wherein a first bit line of the at least three bit lines of the first memory cell array is connected to a data line of a middle data line pair of the data lines and a first bit line of the at least three bit lines of the second memory cell array is connected to another data line of the middle data line pair, a second bit line of the at least three bit lines of the first memory cell array is connected to a data line of an outer data line pair of the data lines and a second bit line of the at least three bit lines of the second memory cell array is connected to another data line of the outer data line pair, and a third bit line of the at least three bit lines of the first memory cell array is connected to a data line of an inner data line pair of the data lines and a third bit line of the at least three bit lines of the second memory cell array is connected to another data line of the inner data line pair.

2. The semiconductor memory device of claim 1, wherein the at least three bit lines include a first conductive wiring layer, and the data lines include a second conductive wiring layer.

3. The semiconductor memory device of claim 1, wherein the second direction is perpendicular to the first direction.

4. The semiconductor memory device of claim 1, wherein each bit line of the second memory cell array and its corresponding bit line of the first memory cell array form a complementary bit line pair.

5. The semiconductor memory device of claim 1, wherein the semiconductor memory device is included in a memory chip of a memory module, and wherein the memory chip is mounted on a printed circuit board.

6. The semiconductor memory device of claim 1, wherein the semiconductor memory device is included in a system having a controller for controlling the semiconductor memory device through a bus.

\* \* \* \* \*